United States Patent [19]

Imai

[11] Patent Number: 5,569,930

[45] Date of Patent: Oct. 29, 1996

[54] SUBSTRATE HEIGHT POSITION DETECTING APPARATUS WHEREIN A STOP PLATE TRANSMITS A PATTERN OF OBLIQUE LIGHT BEAMS WHICH ARE REFLECTED BY THE SUBSTRATE

[75] Inventor: Yuji Imai, Ohmiya, Japan

[73] Assignee: Nikon Corporation, Tokyo, Japan

[21] Appl. No.: 333,291

[22] Filed: Nov. 1, 1994

[30] Foreign Application Priority Data

Nov. 8, 1993 [JP] Japan .................................. 5-278395

[51] Int. Cl.⁶ .................................................. G01N 21/86
[52] U.S. Cl. .......................... 250/559.4; 250/548; 355/53
[58] Field of Search ............................ 250/201.2, 559.4, 250/548; 355/53; 356/399, 400, 401

[56] References Cited

U.S. PATENT DOCUMENTS

| 4,558,949 | 12/1985 | Uehara et al. ........................ 356/152 |
| 4,681,430 | 7/1987 | Goel et al. ................................ 355/53 |
| 4,814,829 | 3/1989 | Kosugi et al. ............................ 355/53 |
| 4,993,837 | 2/1991 | Oshida et al. .......................... 250/548 |
| 4,999,669 | 3/1991 | Sakamoto et al. ....................... 355/53 |
| 5,008,705 | 4/1991 | Sindledecker ............................ 355/53 |
| 5,101,226 | 3/1992 | Beaulieu et al. ......................... 355/53 |
| 5,118,957 | 6/1992 | Kawashima et al. ................. 250/559.4 |
| 5,298,939 | 3/1994 | Swanson et al. ......................... 355/53 |

FOREIGN PATENT DOCUMENTS 63-161616   7/1988   Japan .

*Primary Examiner*—Stephone Allen
*Attorney, Agent, or Firm*—Shapiro and Shapiro

[57] ABSTRACT

To detect the height position of a substrate, a stop-plate having a plurality of slits applies light beams of elongated cross-section to the substrate obliquely. A sensor having a plurality of sensor elements receives light beams reflected from the substrate and outputs signals for controlling the height of the substrate. Additional light beams and sensor elements may be provided to output information regarding the direction of height deviation and the amount of height deviation.

12 Claims, 3 Drawing Sheets

SUBSTRATE HEIGHT POSITION DETECTING APPARATUS WHEREIN A STOP PLATE TRANSMITS A PATTERN OF OBLIQUE LIGHT BEAMS WHICH ARE REFLECTED BY THE SUBSTRATE

BACKGROUND OF THE INVENTION

1. Field of the Invention

This invention relates to a substrate height position detecting apparatus, and particularly to a substrate height position detecting apparatus for setting the surface of a substrate such as a wafer at the focus position of a projection optical system in an exposure apparatus.

2. Related Background Art

The technique disclosed in U.S. Pat. No. 4,558,949, etc. is known as a technique of detecting the height position of a substrate of this kind. This is a technique of projecting a beam of imaging light from an oblique direction to the surface of a substrate (wafer), receiving the reflected beam of light from the wafer by a photoelectric detector through a slit plate while vibrating the reflected beam of light, synchronously detecting and processing a photoelectric signal outputted from the photoelectric detector by a vibration signal for vibrating the reflected beam of light, finding the amount of difference between the imaging plane (best focus plane) of a projection optical system and the surface of the wafer in the direction of height (the direction of the Z-axis), servo-controlling a Z stage so that said amount of difference may become 0, and bringing the height position of the wafer into coincidence with the best focus plane.

Also, in recent years, a height position detecting system (hereinafter referred to as the "multipoint AF system") for detecting the height positions at a plurality of points on a wafer has been proposed because if the measuring point for the measurement of the height position of the wafer is single, an accurate height position cannot be detected under the influence of the level difference of the surface of the wafer. This multipoint AF system applies, for example, a plurality of slit lights arranged at a predetermined pitch from an oblique direction to the wafer, and highly accurately detects the height positions at a plurality of points on the wafer on the basis of the relative position between the reflected lights of the plurality of slit lights from the wafer and a plurality of light receivers (light receiving elements) corresponding to the respective slit lights.

Also, Japanese Patent Application Laid-Open No. 63-161616 discloses, in a height position detecting system for projecting a beam of imaging light onto a point on a wafer and also receiving the reflected light thereof by a light receiving element, thereby detecting the height position of a wafer, a technique whereby when the reflected light from the wafer deviates from the light receiving area of the light receiving element (when the height position of the wafer deviates from the range of height position detectable by the light receiving element), that reflected light is photoelectrically detected by sensors for detecting the direction of deviation provided on both sides of the light receiving element, thereby detecting the direction of deviation of the wafer from the best focus position.

However, in the multipoint AF system as described above, the provision of sensors for detecting the direction of deviation on both sides of a plurality of light receiving elements as in the prior art has made the apparatus construction of the multipoint AF system bulky (limits the arrangement of the measuring points and the optical system) and has not been realistic. Particularly, in the multipoint AF system wherein a plurality of slit lights are applied from an oblique direction to a wafer to thereby form a plurality of slit images arranged at a predetermined pitch in the direction of measurement on the wafer, and the reflected lights of the respective slit lights are individually detected by a plurality of light receivers, the slit images on the wafer deviate in the direction of arrangement of the slit images by the height position of the wafer deviating from a target position. When the amount of deviation between these slit images on the wafer becomes ½ of the pitch of the slit images (the interval between two adjacent slit images), these reflected lights enter the corresponding light receivers while deviating from one another. Accordingly, the other light receivers than the endmost light receiver output signals similar to those when the surface of the wafer is at the target position. In spite of the surface of the wafer deviating from the target position at this time, there has been a problem that the multipoint AF system erroneously detects the then position of the surface of the wafer as the target position.

SUMMARY OF THE INVENTION

In view of the above-noted problem, the present invention has as an object the provision of a substrate height position detecting apparatus which, without limiting the arrangement of a plurality of measuring points on a substrate, can highly accurately detect the height position at each measuring point with a high throughput.

In accordance with one aspect of the invention, a position detecting apparatus for detecting the height position of a substrate includes: a light source for applying a plurality of beams of light from an oblique direction to the substrate, a sensor for individually receiving light of the plurality of beams reflected from the substrate, and outputting a signal corresponding to the position of the substrate, a substrate stage holding the substrate thereon and movable in the direction of height and in XY directions in a plane substantially perpendicular to the direction of height, and a control system for controlling the substrate stage based on a signal from the sensor, the light source having a member that provides the plurality of beams of light applied to the substrate with elongated cross-sections extending in a direction intersecting the XY directions, the directions of incidence of the plurality of beams of light being in planes that are substantially perpendicular to the substrate and that are parallel to one of the X and Y directions.

In accordance with another aspect of the invention, a position detecting apparatus for detecting the height position of a substrate includes: a first member for applying a plurality of first beams of light from an oblique direction to the substrate, and forming a plurality of first light application points arranged in the form of a straight line at predetermined intervals on the substrate, a first sensor for individually receiving reflected light from the first application points, a substrate stage holding the substrate stage thereon and movable in the direction of height, a control system for controlling the substrate stage based on an output from the first sensor, a second member for applying a beam of light forming a second light application point on the substrate, and a second sensor for receiving reflected light from the second application point, and outputting information regarding the direction of the positional deviation between the substrate and a reference position.

DETAILED DESCRIPTION OF THE PREFERRED EMBODIMENTS

A first embodiment of the present invention will hereinafter be described with reference to the drawings. This embodiment is one in which the present invention is applied to the auto focusing mechanism of a projection exposure apparatus of the slit scan exposure type in which a reticle and a wafer are synchronously scanned relative to an illuminated area of a rectangular shape, an arcuate shape or like shape (hereinafter referred to as the "slit-like illuminated area") to thereby expose the pattern of the reticle onto the wafer.

Figure 1:
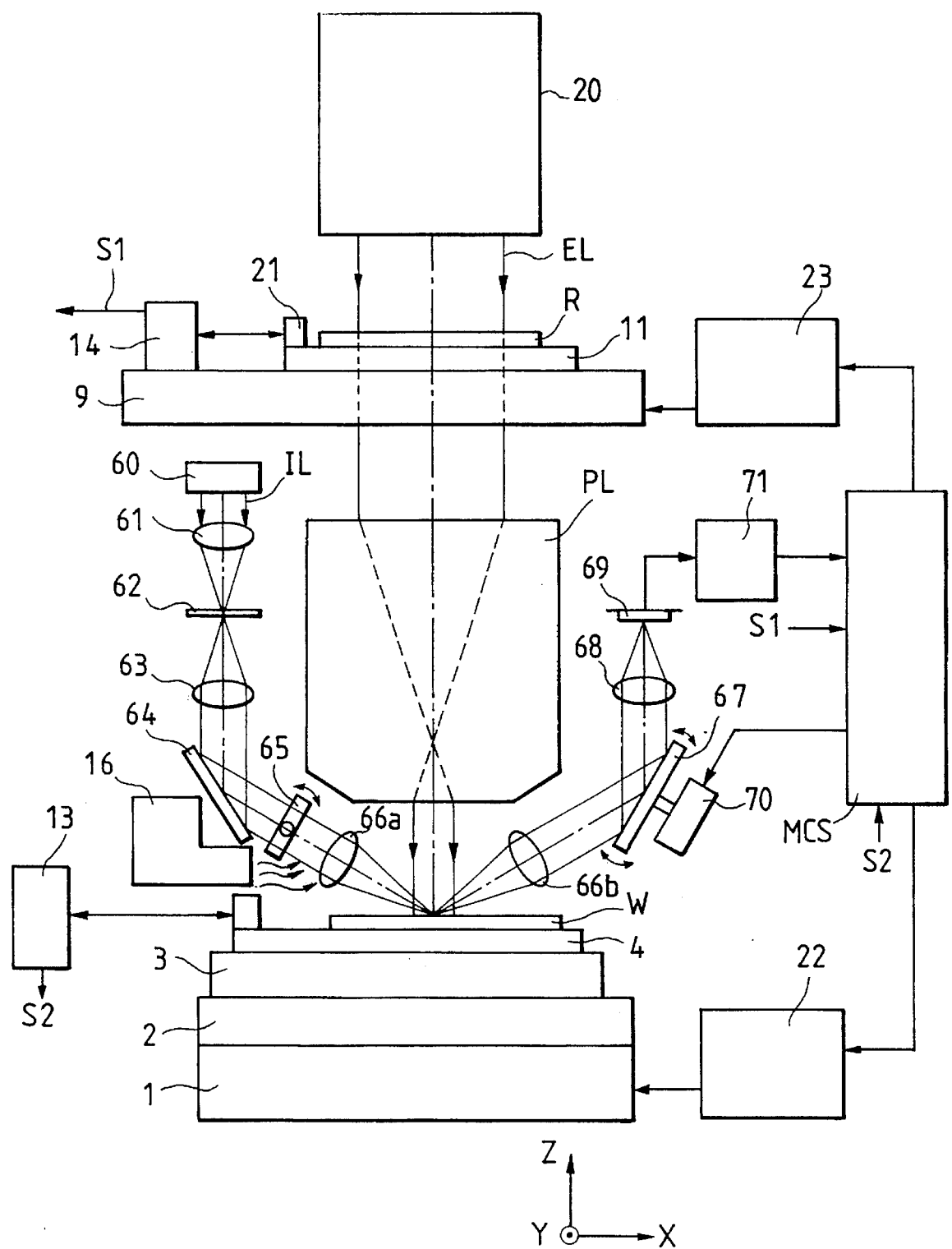
FIG. 1 shows a projection exposure apparatus to which is applied a first embodiment of a height position detecting apparatus according to the present invention.

Referring to FIG. 1 which shows the projection exposure apparatus of the present embodiment, a slit-like illuminated area is formed on a reticle R by exposure light EL from an illuminating optical system 20 which is formed into a slit-like shape, and the image of a pattern on the reticle R present in the slit-like illuminated area is projected and exposed onto a wafer W through a projection optical system PL. At this time, the reticle R is scanned at a constant velocity V in a direction perpendicular to the plane of the drawing sheet of FIG. 1 relative to the slit-like illuminated area by the exposure light EL and also, the wafer W is scanned at a constant velocity V/β (1/β being the reduction magnification of the projection optical system PL) in an opposite direction perpendicular to the plane of the drawing sheet of FIG. 1 in synchronism with the scanning of the reticle R.

A reticle stage 11 drivable in Y direction, X direction and a rotational direction (θ direction) in XY plane in FIG. 1 is placed on a reticle supporting table 9, and the reticle R is held on this reticle stage 11 by a vacuum chuck or the like. A movable mirror 21 is disposed on the reticle stage 11, and the positions of the reticle stage 11 in X direction, Y direction and θ direction are normally monitored by an interferometer 14 disposed on the reticle supporting table 9. Positional information S1 obtained by the interferometer 14 is supplied to a main control system MCS, which thus controls the positioning operation of the reticle stage 11 through a reticle driving device 23.

A Y stage 2 drivable in the direction of the Y-axis is placed on a wafer supporting table 1, and an X stage 3 drivable in the direction of the X-axis is placed thereon, and further a Z stage 4 drivable in the direction of the Z-axis is provided on the X stage. The wafer W is held on this Z stage 4 by vacuum. A movable mirror 7 is also fixed on the Z stage 4, and the positions of the Z stage 4 in X direction, Y direction and θ direction are normally monitored by an interferometer 13 disposed outside. Positional information S2 of the wafer W on the XY coordinates system obtained from the interferometer 13 is also supplied to the main control system MCS.

In the projection exposure apparatus according to the present embodiment, there is provided an air conditioner 16 for air-conditioning the space between the wafer W disposed on the Z stage 4 and the projection optical system PL. This air conditioner 16, as shown in FIG. 1, is disposed so as to send a cleaned air flow from X direction to the space between the wafer W and the projection optical system PL, thereby preventing the fluctuation of the air from being created in said space. Also, the main control system MCS controls the positioning operations of the Y stage 2, the X stage 3 and the Z stage 4 through a wafer driving device 22 and controls the operation of the entire apparatus.

A description will now be given of a height position detecting system (a multipoint AF system) incorporated in the present apparatus.

Illuminating light (a beam of light) IL which does not sensitize photoresist on the wafer W, unlike the exposure light EL from the illuminating light source 20, is emitted from a light source 60. The beam of light IL emitted from the light source 60 passes through a condensing lens 61 and illuminates a pattern forming plate 62. The pattern forming plate 62 is provided with a plurality of opening patterns of a predetermined shape, and the beam of light IL transmitted through this pattern forming plate 62 is applied to the surface of the wafer W via a lens 63, a mirror 64, plane parallel plate glass 65 and an application objective lens 66a. That is, the images of these opening patterns are projected and formed on the surface of the wafer W. Also, the plane parallel plate glass 65 has a rotational axis of which the lengthwise direction is a direction perpendicular to the plane of the drawing sheet of FIG. 1, and is rotatable about this rotational axis within a predetermined angle range. By inclining this plane parallel plate glass 65, it is possible to adjust the positions of the images of the patterns projected onto the surface of the wafer W.

The beam of light (reflected light) IL reflected by the wafer W is again projected onto the light receiving surface of a light receiver 69 via a condensing objective lens 66b, a rotational direction vibration plate 67 and an imaging lens 68, and the images of the plurality of patterns on the pattern forming plate 62 are re-formed on this light receiving surface. The light receiver 69 has a plurality of light receiving elements for individually receiving the reflected lights of the plurality of pattern images projected onto the wafer W, and a detection signal from each light receiving element is supplied to a signal processing device 71. The main control system MCS imparts vibrations to the rotational direction vibration plate 67 through an excitation device (such as a vibrator or an ultrasonic vibrator) 70. The reflected lights of the slit images from the wafer W are all vibrated by the rotational direction vibration plate 67 and therefore, each pattern image re-formed on the light receiver 69 and each light receiving element are vibrated relative to each other. The signal processing device 71 synchronously detects the detection signals from the plurality of light receiving elements on the light receiver 69 by the vibration signal of the excitation device 70 and obtains a focus signal (an S curve signal), and supplies this focus signal to the main control system MCS. The main control system MCS drives the plane parallel plate glass 65 in advance to thereby adjust the inclination of the plane parallel plate glass 65 so that each focus signal may become 0 when the surface of the wafer W coincides with a reference plane (for example, the imaging plane of the projection optical system PL).

Figure 2A:
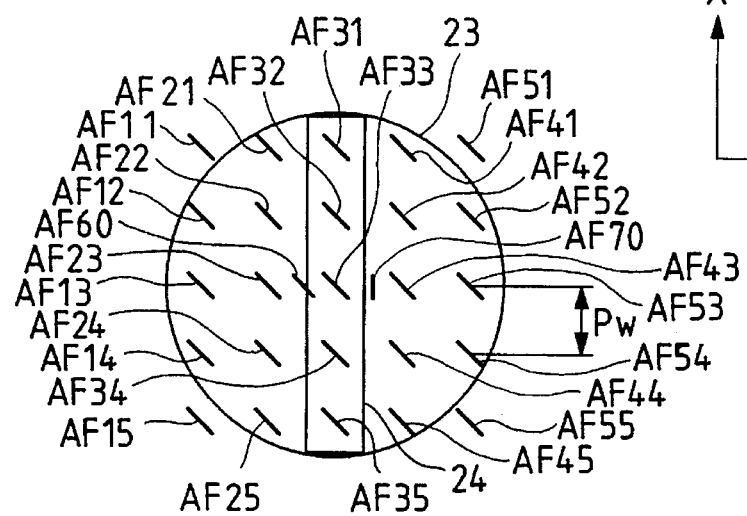
FIG. 2A is a plan view showing the arrangement of slit-like opening pattern images projected onto a wafer.
Figure 2B:
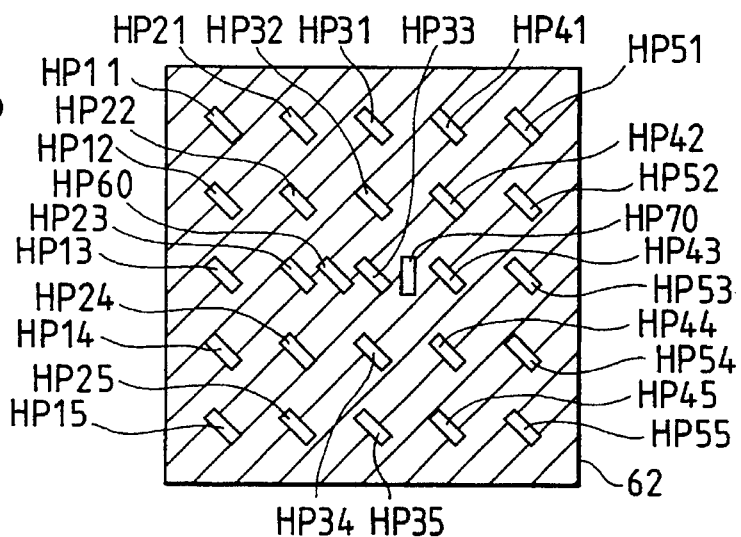
FIG. 2B is a plan view showing the arrangement of opening patterns on the pattern forming plate of a height position detecting system.

FIG. 2B shows an example of slit-like opening patterns formed on the pattern forming plate 62. As shown in FIG. 2B, five columns of opening patterns are formed on the pattern forming plate 62, and five opening patterns are arranged at equal intervals in each column. That is, five opening patterns HP11–HP15 are formed in the first column, and five opening patterns HP21–HP25, HP31–HP35, HP41–HP45 and HP51–HP55 are also formed in the second to fifth columns, respectively.

Also, in FIG. 2B, an opening pattern HP60 is formed between the opening pattern HP23 in the second column and the opening pattern HP33 in the third column, and an opening pattern HP70 is formed between the opening pattern HP33 in the third column and the opening pattern HP43 in the fourth column. Thus, twenty-seven opening patterns in total are formed on the pattern forming plate 62.

FIG. 2A shows the states of the images or (hereinafter referred to as the "slit images" or "application points") AF11–AF55, AF60 and AF70 of opening patterns HP11–HP55, HP60 and HP70, respectively, formed on the wafer W by light beams provided with elongated (specifically, rectangular) cross-sections by pattern forming plate 62. In FIG. 2A, the patterns of the reticle R of FIG. 1 are exposed onto the surface within a rectangular exposure field 24 inscribed to the circular illumination field 23 of the projection optical system PL and having X direction as its lengthwise direction.

Now, in the substantially central portion of the exposure field 24, five slit images AF31–AF35 of the third column are formed in a column extending in the lengthwise direction (X direction) of the exposure field 24, and the center point of the exposure field 24 and the center point of the third slit image AF33 of the third column substantially coincide with each other. Further, five measuring points AF11–AF15 of the first column and five slit images AF21–AF25 of the second column are applied to the −Y direction side of the exposure field 24, and five measuring points AF41–AF45 of the fourth column and five slit images AF51–AF55 of the fifth column are applied to the +Y direction side of the exposure field 24. Also, the lengthwise direction of these slit images (AF11–AF55) is inclined by 45° with respect to X (or Y) direction. Generally, the patterns formed on the wafer are arranged in a lattice-like shape with X (or Y) direction as their lengthwise direction. Accordingly, the lengthwise direction of the slit images is inclined in a direction (e.g. 45°) intersecting X (or Y) direction so that the direction of the reflected light of the slit images may not be varied by the direction of these patterns. The five slit images (e.g. AF51–AF55) in each column are arranged at predetermined intervals Pw. Also, in the multipoint AF system of the present embodiment, these slit images AF11–AF55 are for finding the amount of deviation between the wafer W and the imaging plane of the projection optical system PL in the direction of the optical axis AX (the direction of the Z-axis), i.e., the height position of the wafer, with the center points of the respective slit images as measuring points.

Also, as shown in FIG. 2A, the image of an opening pattern HP60 is formed as a slit image AF60 between the slit images AF23 and AF33 on the surface of the wafer W, and the image of an opening pattern HP70 is formed as a slit image AF70 between the slit images AF33 and AF43 on the surface of the wafer W. The slit image AF60 is substantially equal in size to each of the slit images AF11–AF55, and the lengthwise direction of this slit image AF60, like the slit images AF11–AF55, is inclined by 45° with respect to X (or Y) direction. Also, the slit image AF70 has X direction as its lengthwise direction. Also, in FIG. 2A, the center points of the third slit images AF13, AF23, AF33, AF43, AF53 in the respective columns, the center point of the slit image AF60 and the center point of the slit image AF70 are all on the same straight line parallel to the Y-axis.

The beams of light forming these slit images AF11–AF55, AF60 and AF70 are applied obliquely to the surface of the wafer W with XZ plane as the plane of incidence onto the wafer W. Accordingly, when the height position of the wafer W changes, the applied position of each slit image moves along X direction (the column direction of the slit images AF11–AF55).

Also, as in the present embodiment, by the beams of light of the multipoint AF system being applied onto the wafer W from a direction of 0° with respect to the XZ plane, as compared with a case where the beams of light are applied, for example, from a direction forming an angle of 45° with respect to the XZ plane, it becomes possible to reduce the size of the pattern forming plate 62 shown in FIG. 2B. This in turn leads to the advantage that the aperture of the lens in the optical system of the multipoint AF system can be made small. Further, an air flow is sent from X direction (non-scan direction) to the space between the wafer W and the projection optical system PL by the air conditioner 16 and therefore, the air flow is not disturbed by optical members (such as the application optical system 66a and the condensing optical system 66b) constituting the multipoint AF system.

Figure 2C:
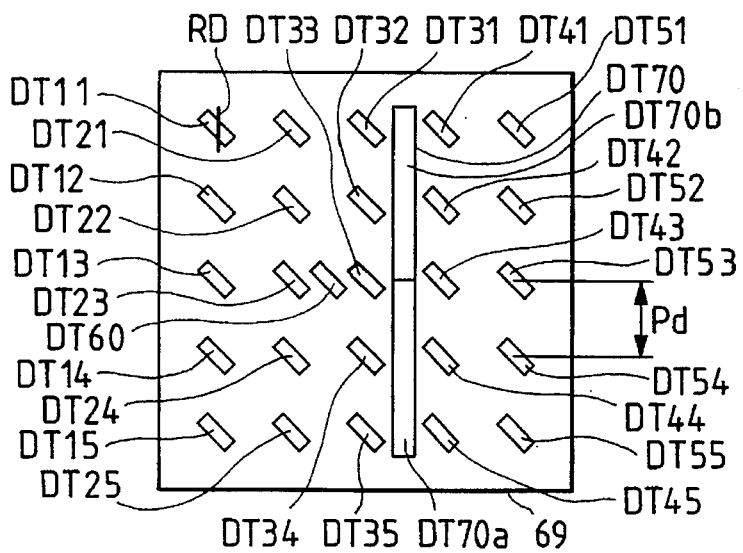
FIG. 2C is a plan view showing the arrangement of light receiving elements on a light receiver.

FIG. 2C shows the state of the light receiving surface of the light receiver 69 in FIG. 1. On this light receiving surface, correspondingly to the slit images AF11–AF55 in FIG. 2A, five light receiving elements DT11–DT15 of the first column are disposed and each five light receiving elements DT21–DT55 are also disposed in the second to fifth columns. The five light receiving elements in each column are arranged at predetermined intervals Pd. Also, a light receiving element DT60 for receiving the reflected light of the slit image AF60 is disposed between the light receiving elements DT23 and DT33. This light receiving element DT60 is substantially equal in size to each of the light receiving elements DT11–DT55. Further, a light receiving element (direction discriminating sensor) 70 extending in the column direction of the light receiving elements is disposed between the light receiving elements DT31–DT35 of the third column and the light receiving elements DT41–DT45 of the fourth column, and receives the reflected light of the slit image AF70. This direction discriminating sensor 70 is bisected into a light receiving area 70a and a light receiving area 70b in the column direction. Also, the borderline between the light receiving areas 70a and 70b, the center points of the third light receiving elements DT13, DT23, DT33, DT43 and DT53 in the respective columns and the center point of the light receiving element DT60 are all on the same straight line. Also, a slit-like stop, not shown, is disposed on the light incidence side of each light receiving element of the light receiver 69 so that any other light (for example, stray light) than the reflected light of each slit image may not enter. Also, as previously described, the reflected lights of the slit images from the wafer W are all rotated and vibrated by the rotational direction vibration plate 67 as shown in FIG. 1 and therefore, the position of each image reformed on the light receiver 69 vibrates in a direction RD which is the column direction of the light receiving elements as shown in FIG.

2C. Also, the light receiving element DT60 and the light receiving areas 70a and 70b of the direction discriminating sensor DT70 detect only the presence or absence of the incidence of the light and output detection signals to the signal processing device 71. No detection signal is outputted from the direction discriminating sensor 70 when the reflected light of the slit image AF70 is applied onto the borderline between the light receiving areas 70a and 70b.

When the height position of the wafer is at the best focus position of the projection optical system PL, the slit images AF11–AF55 for detecting the height position are re-formed on the corresponding light receiving elements DT11–DT55, respectively. The light receiving elements DT11–DT55 which have received the slit images AF11–AF55 output detection signals to the signal processing device 71 in FIG. 1, which in turn outputs focus signals corresponding to the respective detection signals to the main control system MCS. Likewise, the slit image AF60 is re-formed on the light receiving element DT60, which thus outputs a detection signal to the main control system MCS through the signal processing device 71. The detection signal from this light receiving element DT60 is a signal for informing that the reflected lights of the slit images AF11–AF55 have entered the corresponding light receiving elements, respectively. Also, the slit image AF70 is re-formed on the borderline of the direction discriminating sensor DT70.

When the height position of the wafer moves in +Z direction from the best focus position, the slit images AF11–AF55, AF60 and AF70 shift to the upper side in FIG. 2C on the light receiving surfaces. At this time, the slit image AF70 is re-formed on the light receiving area DT70b, which thus outputs a signal for informing that the wafer W deviates in +Z direction from the best focus position. Likewise, when the wafer W moves in –Z direction, each slit image shifts to the lower side in FIG. 2C. At this time, the slit image AF70 is re-formed on the light receiving area DT70a, which thus outputs to the signal processing device 71 a signal for informing that the wafer W deviates in –Z direction from the best focus position.

A description will now be given of the operation of disposing the height position of the surface of the wafer W near the best focus plane.

First, the main control system MCS disposes the shot area (the first shot area) of a plurality of shot areas already formed on the wafer W which is to be first exposed below the projection optical system PL. Before entering the exposing operation of exposing the pattern on the reticle R onto the wafer W, the surface of the wafer W is disposed near the best focus plane on the basis of signals from the light receiving elements DT60 and DT70. At this time, consider, for example, a case where the surface of the wafer W is already near the best focus position.

At this time, the light receiving elements DT11–DT55 receive the reflected lights of the slit images AF11–AF55 on the wafer W and the light receiving element DT60 receives the reflected light of the slit image AF60, and the main control system MCS inputs the signal from the light receiving element DT60 through the signal processing device 71 and therefore, judges that the surface of the wafer is near the best focus position.

When the surface of the wafer is disposed near the best focus position, the main control system MCS now brings the surface of the wafer into coincidence with the best focus position on the basis of signals from the light receiving elements DT11–DT55. The signal processing device 71 outputs the focus signals at the respective measuring points (the center points of the slit images AF11–AF55) on the wafer to the main control system MCS on the basis of the detection signals from the light receiving elements DT11–DT55 of the first to fifth columns. The main control system MCS measures the height position of each measuring point on the basis of each focus signal, finds, for example, the imaginary plane of the area on the wafer W, and controls the driving of the Z stage so that the imaginary plane on the shot areas on the wafer W may coincide with the best focus position. The main control system MCS then controls the driving of the Y stage 2 and the X stage 3 and exposes the pattern of the reticle R onto the wafer W.

Next, consider a case where the surface of the wafer W deviates in –Z direction from the best focus position and the reflected lights of the slit images AF11–AF55 enter the light receiving elements adjacent to the respective ones of the corresponding light receiving elements (such a state will hereinafter be called the "pitch deviation"). Of the light receiving elements AF11–AF55, the light receiving elements other than the first light receiving elements (DT11, DT21, DT31, DT41, DT51) in the respective columns receive the reflected lights of the slit images. However, the light receiving area 70a of the direction discriminating sensor 70 receives the reflected light from the slit image AF70, and the reflected light of the slit image AF60 is applied to a position deviating from the light receiving element 60 and therefore, the detection signal from the light receiving element DT60 is not inputted to the main control system MCS, but the detection signal from the direction discriminating sensor 70a is inputted thereto. Accordingly, the main control system MCS judges that the surface of the wafer W deviates in –Z direction from the best focus position. The main control system MCS then drives the Z stage in +Z direction through the wafer driving device 22.

Now, attention is called to the slit image AF33. When the reflected light of the slit image AF33 has entered the light receiving element DT33 in the course of the Z stage being driven in +Z direction, the reflected light of the slit image AF70 is still applied onto the light receiving area DT70b. That is, at this time, the direction discriminating sensor 70 still outputs to the main control system MCS a signal informing that the wafer W deviates from the best focus position. Accordingly, the main control system MCS cannot discriminate whether the beam of light received by the light receiving element DT33 is the slit image AF33 or the reflected light of the slit image AF32 deviating by one pitch therefrom. At this time, however, the light receiving element DT60 receives the reflected light of the slit image AF60 and the main control system MCS inputs the detection signal from the light receiving element DT60 through the signal processing device 71 and therefore, judges that the light receiving element DT33 has received the reflected light of the slit image AF33. That is, the main control system MCS judges that the reflected lights of the slit images AF11–AF55 have entered the corresponding light receiving elements DT11–DT55, respectively. Accordingly, the main control system MCS stops the driving of the Z stage 4 in +Z direction when it inputs the detection signal from the light receiving element DT60.

When the surface of the wafer is disposed near the best focus position, the main control system MCS, similarly to the above-described operation, brings the surface of the wafer into coincidence with the best focus position on the basis of the signals from the light receiving elements DT11–DT55, whereafter the pattern of the reticle is exposed onto the wafer.

Also, when the surface of the wafer W deviates in +Z direction, the height direction is operated in the direction opposite to that during the previous operation for the deviation in −Z direction, whereby the shot areas on the wafer W can be brought into coincidence with the best focus position.

By the construction and operation as described above, it becomes possible to quickly dispose the surface of the wafer near the best focus plane even when the height position of the surface of the wafer deviates from the best focus position (particularly when pitch deviation occurs). Also, when exposing the first shot area, the surface of the wafer is substantially coincident with the best focus position and therefore, for the shot areas to be exposed at the second and subsequent times, it is not necessary to perform the above-described operation of disposing the surface of the wafer near the best focus position.

Also, the operation of disposing the surface of the wafer near the best focus position as described above may be performed simultaneously with the wafer prealignment operation after the wafer has been disposed on the stage.

In the present embodiment, the beam of light forming the slit image AF70 may not be applied, but only the slit image AF60 may be used. In this case, two light receiving areas DT70a and DT70b of the direction discriminating sensor DT70 are disposed on both sides of the light receiving element DT60 for receiving the reflected light of the slit image AF60.

A second embodiment of the present invention will now be described with reference to FIGS. 1 and 3A to 3C. This embodiment differs from the first embodiment shown in FIG. 1 only in the constructions of the pattern forming plate 62 and the light receiver 69 and the signal processing method by the signal processing device 71, and is similar in the other points to the first embodiment. Accordingly, members functionally similar to those in the first embodiment need not be described.

Figure 3A:
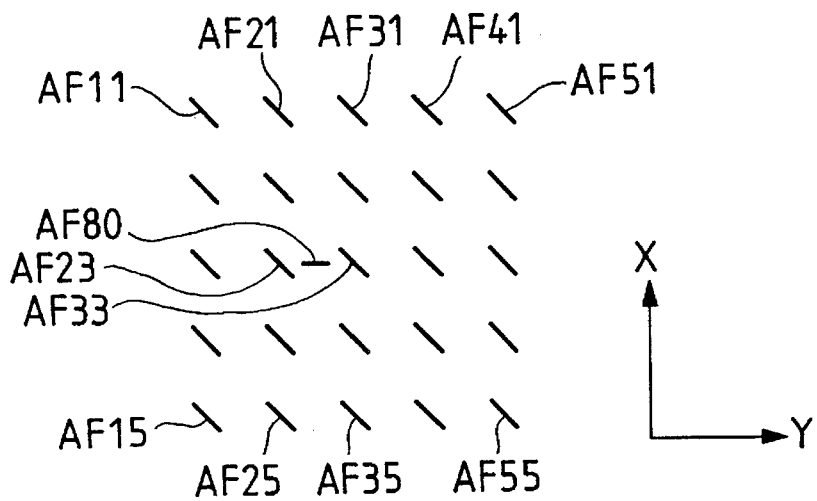
FIG. 3A is a plan view showing the arrangement of slit-like opening pattern images projected onto a wafer in a second embodiment.
Figure 3B:
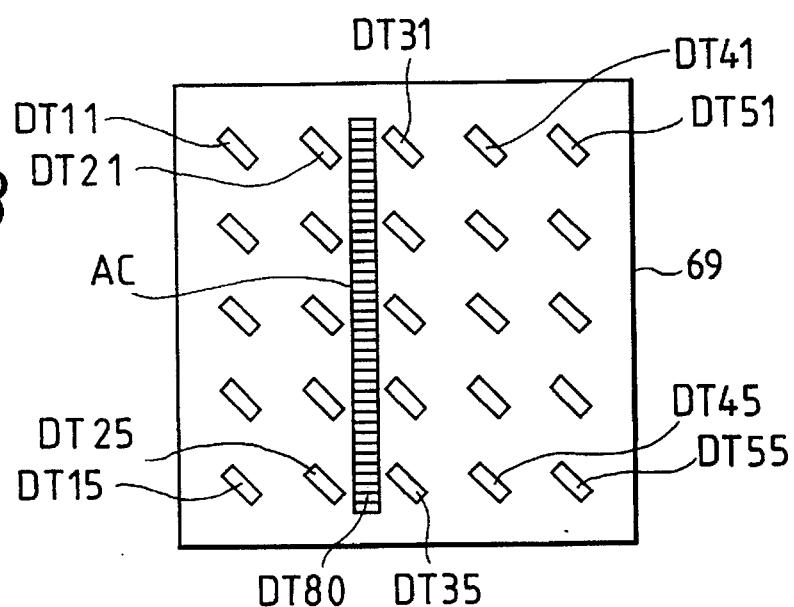
FIG. 3B is a plan view showing the arrangement of light receiving elements on a light receiver in the second embodiment.

The pattern forming plate, not shown, in the present embodiment is provided with an opening pattern at the position of the opening pattern HP60 in FIG. 2B, besides the twenty-five opening patterns (HP11–HP55), as in the first embodiment shown in FIG. 2B. As shown in FIG. 3A, slit image AF11–AF55 for focus detection are formed on the wafer by these opening patterns and besides, a slit image AF80 having Y direction as its lengthwise direction is formed between the slit image AF23 and the slit image AF33. As shown in FIG. 3B, on the light receiving surface of the light receiver 69, besides the light receiving elements DT11–DT55 shown in FIG. 2C, as in the first embodiment, a light receiving element DT80 for receiving the reflected light of a slit image AF80 is disposed between the light receiving elements DT21–DT25 of the second column and the light receiving elements DT31–DT35 of the third column. This light receiving element DT80 is an array sensor having a plurality of light receiving areas arranged in the column direction of the light receiving elements DT11–DT55. The light receiving elements DT11–DT55, as in the first embodiment, output detection signals to the signal processing device 71 when they receive the reflected lights from the slit images AF11–AF55. Likewise, the array sensor DT80 outputs a detection signal to the signal processing device 71 in FIG. 1 when it receives the reflected light from the slit image AF80. The signal processing device 71, with the central portion of the array sensor DT80 as a reference position AC (hereinafter referred to as the "center position AC"), measures the amount and direction of deviation between the received position of the reflected light of the slit image AF80 and the center position AC. This center position AC is on a straight line passing through the center points of the third light receiving elements DT13, DT23, DT33, DT43 and DT53 of the respective columns. When the reflected light of the slit image AF80 is applied to the center point of the array sensor, the height position of the wafer W is coincident with the best focus position.

A description will now be given of the operation of disposing the surface of the wafer W near the best focus plane before entering the exposing operation of exposing the pattern on the reticle R onto the wafer W.

First, the arry sensor DT80 outputs a detection signal to the signal processing device 71 when it receives the reflected light of the slit image AF80. The signal processing device 71, as described above, measures the direction and amount of deviation of the received position of the slit image AF80 from the center position AC, and outputs them to the main control system MCS. The main control system MCS servo-controls the Z stage 4 to thereby dispose the height position of the wafer W near the best focus position so that the reflected light of the slit image AF80 may come to the center position AC of the array sensor.

When the wafer W is disposed near the best focus position, the main control system MCS, as in the first embodiment, controls the driving of the Z stage on the basis of a focus signal from the signal processing device 71 so that the shot area on the wafer W may coincide with the best focus position.

As described above, in the present embodiment, the amount and direction of deviation of the height position of the wafer from the best focus position can be known at the same time, and even when pitch deviation occurs, it becomes possible to quickly dispose the surface of the wafer near the best focus position.

Figure 3C:
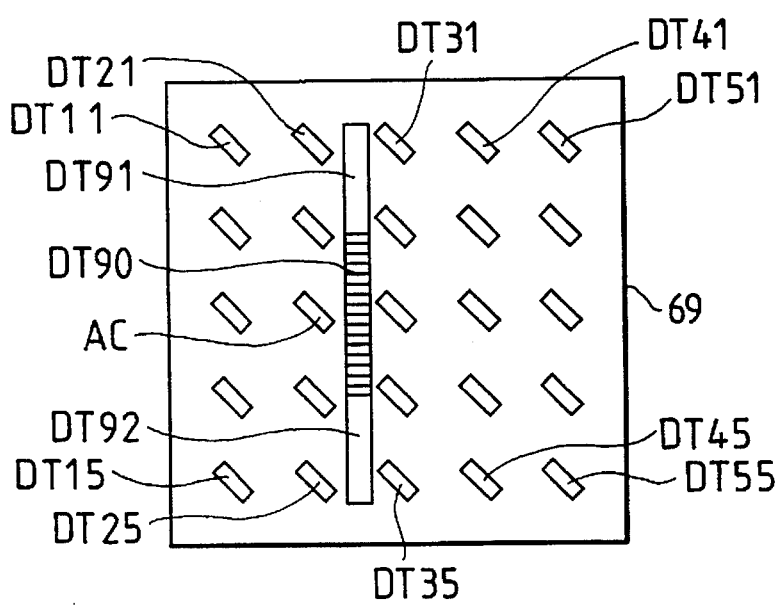
FIG. 3C is a plan view showing a modification of the light receiving elements provided on the light receiver in the second embodiment.

Also, as a modification of the present embodiment, there is shown in FIG. 3C an example in which the length of the array sensor is shortened (the number of the light receiving areas is reduced) to simplify the signal processing of the array sensor by the signal processing device 71. This example, like the second embodiment, has an elongated light receiving area between the light receiving elements DT21–DT25 of the second column and the light receiving elements DT31–DT35 of the third column. This light receiving area is comprised of an array sensor DT90 disposed in the central portion (between the second one to the fourth one of the light receiving elements DT11–DT55), and direction discriminating sensors DT91 and DT92 disposed on both sides thereof. The direction discriminating sensors DT91 and DT92, like the light receiving areas DT70a and DT70b of the direction discriminating sensor 70 shown in FIG. 2C, output to the signal processing device 71 signals for informing of the direction of deviation of the height position of the wafer from the best focus position when they receive the reflected light from the slit image AF80. Also, the array sensor DT90, as in the second embodiment, has the center position AC. When the array sensor DT90 receives the reflected light of the slit image AF80, it outputs a detection signal to the signal processing device 71, which, as in the second embodiment, measures the amount and direction of deviation between the received position of the reflected light of the slit image AF80 and the center position AC.

By such a construction, when for example, the height position of the wafer W deviates from the best focus position, whereby the reflected light of the slit image AF80 enters the direction discriminating sensor DT91, the main control system MCS judges that the surface of the wafer W deviates in +Z direction from the best focus position, and drives the Z stage 4 in −Z direction through the wafer driving device 22. When the reflected light of the slit image AF80 enters the array sensor DT90, the main control system MCS servo-controls the Z stage 4 to thereby dispose the height position of the wafer W near the best focus position so that the reflected light of the slit image AF80 may come to the center position of the array sensor.

In the second embodiment, even if a beam of light forming the slit image AF80 is not applied but a beam of light forming the slit images AF11–AF55 for detecting the height position is simply applied, it will be possible to detect the direction of deviation of the reflected lights of the slit images AF11–AF55 on the light receiver 69 (the direction of deviation of the height position of the wafer). This is achieved by providing, instead of the array sensor DT80, direction discriminating sensors on both sides of the light receiving elements DT31–DT35 of the third column. By such a construction, when the reflected lights of the slit images AF11–AF55 deviate, for example, upwardly in FIG. 3B, the reflected light of the slit image AF31 enters the direction discriminating sensor provided adjacent to the light receiving element DT31 and therefore, the direction of deviation is detected.

Also, to detect only the pitch deviation, only the light receiving elements DT11–DT55 may be provided on the light receiving surface of the light receiver 69. When in FIG. 3C, the reflected lights of the slit images AF11–AF55 enter, for example, all the light receiving elements other than the first light receiving elements DT11, DT21, DT31, DT41 and DT51 of the respective columns, the main control system judges that pitch deviation has occurred, and drives the Z stage in +Z direction. Likewise, when the lights enter the light receiving elements other than the first and second light receiving elements of the respective columns, the main control system judges that the reflected lights of the slit images AF11–AF55 deviate by two pitches, and drives the Z stage in +Z direction.

The present invention can be applied not only to a projection exposure apparatus of the slit scan exposure type like the above-described first and second embodiments, but also to a reduction projection exposure apparatus (stepper) of the step and repeat type which has heretofore widely been used.

Of course, the present invention is not restricted to the above-described embodiments, but can assume various constructions without departing from the gist of the present invention.

As described above, according to the present embodiment, even when the height position of the substrate deviates from the target position, whereby it becomes impossible to detect the height position, it is possible to detect the direction of deviation of the surface of the substrate from the target position. Accordingly, it is possible to quickly dispose the surface of the substrate at the best focus position, and detect the height position of the substrate highly accurately. Also, even when the reflected lights from the substrate, of a plurality of beams of light for the detection of the height position enter the light receiving elements deviating one by one from the corresponding light receiving elements, it can be known that the height position of the substrate deviates from the target position and thus, it will never happen that the height position is erroneously detected.

Also, on the substrate, an application point is formed on a line differing from the arrangement line of the measuring points for the detection of the height position (the center points of the slit images) and parallel to this arrangement line and therefore, it is possible to detect any deviation between the surface of the substrate and the target position without limiting the arrangement of the measuring points and the optical system in the height position detecting system.

What is claimed is:

1. A position detecting apparatus for detecting the height position of a substrate including:

a light source for applying a plurality of beams of light from an oblique direction to said substrate;

a sensor for individually receiving the reflected light of said plurality of beams of light from said substrate, and outputting a signal corresponding to the position of said substrate;

a substrate stage holding said substrate thereon and movable in the direction of height and in XY directions in a plane substantially perpendicular to said direction of height; and a control system for controlling said substrate stage based on a signal from said sensor;

said light source having a member that provides said plurality of beams of light applied to said substrate with elongated cross-sections extending in a direction intersecting said XY directions, the directions of incidence of said plurality of beams of light being in planes that are substantially perpendicular to said substrate and that are parallel to one of said X direction and said Y direction.

2. The apparatus of claim 1, wherein said member comprises a multi-slit stop plate, and said stop plate is provided at a position substantially optically conjugate with said substrate.

3. The apparatus of claim 1, provided in a projection exposure apparatus having a mask stage holding a mask thereon and at least one-dimensionally movable, and forming an image of the pattern of said mask on said substrate while said mask stage and said substrate stage are moved in synchronism with each other with respect to a projection optical system for projecting said pattern onto said substrate, said planes being parallel to the direction of movement of said mask stage and said substrate stage.

4. The apparatus of claim 1, wherein said cross-section of said beams is rectangular.

5. The apparatus of claim 1, further comprising an air conditioner which conditions air in light paths of said plurality of light beams applied to said substrate.

6. A position detecting apparatus for detecting the height position of a substrate including:

a first member for applying a plurality of first beams of light from an oblique direction to said substrate, and forming a plurality of first light application points arranged in the form of a straight line at predetermined intervals on said substrate;

a first sensor for individually receiving reflected light from said first application points;

a substrate stage holding said substrate thereon and movable in the direction of height;

a control system for controlling said substrate stage based on an output from said first sensor;

a second member for applying a beam of light forming a second light application point on said substrate; and a second sensor for receiving reflected light from said second application point, and outputting information regarding the direction of the positional deviation between said substrate and a reference position.

7. The apparatus of claim 6, wherein said second sensor is an array sensor.

8. The apparatus of claim 6, wherein said second member forms said second application point at a position on said substrate which differs from an imaginary straight line on which said first application points are arranged.

9. The apparatus of claim 6, wherein said control system controls said substrate stage based on an output from said first sensor and an output from said second sensor.

10. The apparatus of claim 6, further including:

a third member for applying a beam of light forming a third light application point on said substrate; and a third sensor for receiving reflected light from said third application point;

said control system controlling said substrate stage based on outputs from said first, second, and third sensors.

11. The apparatus of claim 6, further comprising an air conditioner which conditions air in light paths of said plurality of light beams applied to said substrate.

12. The apparatus of claim 6, wherein said first member forms a plurality of first light application points arranged in the form of a plurality of straight lines at predetermined intervals between application points on each line and between lines, and wherein said second light application point is disposed between a pair of said lines.

* * * * *